United States Patent
Wong et al.

(10) Patent No.: US 10,020,268 B2
(45) Date of Patent: Jul. 10, 2018

(54) RANDOM NUMBER GENERATOR DEVICE AND CONTROL METHOD THEREOF

(71) Applicant: eMemory Technology Inc., Hsin-Chu (TW)

(72) Inventors: Wei-Zhe Wong, Hsinchu County (TW); Ching-Hsiang Hsu, Hsinchu County (TW); Ching-Sung Yang, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/486,310

(22) Filed: Apr. 13, 2017

(65) Prior Publication Data

US 2017/0301406 A1    Oct. 19, 2017

Related U.S. Application Data

(60) Provisional application No. 62/322,237, filed on Apr. 13, 2016.

(51) Int. Cl.
*G11C 17/00* (2006.01)
*H01L 23/00* (2006.01)
(Continued)

(52) U.S. Cl.
CPC ............ *H01L 23/573* (2013.01); *G06F 7/588* (2013.01); *G11C 16/0441* (2013.01);
(Continued)

(58) Field of Classification Search
CPC .................................................. H01L 27/11206
(Continued)

(56) References Cited

U.S. PATENT DOCUMENTS 9,613,714 B1    4/2017 Wong
2008/0246098 A1*   10/2008 Kurjanowicz ......... G11C 17/16
                                    257/408
(Continued)

FOREIGN PATENT DOCUMENTS

JP    H10-92186 A    4/1998
JP    2003-203994 A    7/2003
(Continued)

OTHER PUBLICATIONS

Le Zhang et al., Feasibility Study of Emerging Non-Volatile Memory Based Physical Unclonable Functions, IEEE, XP032614554, 2014.

*Primary Examiner* — Hoai V Ho
(74) *Attorney, Agent, or Firm* — Winston Hsu

(57) ABSTRACT

A random number generator device has at least at least a memory unit, a voltage generator, and a control circuit. Each memory unit has two memory cells, one of the two memory cells is coupled to a bias line and a first bit line, and another of the two memory cells is coupled to the bias line and a second bit line. The voltage generator provides the two memory cells a bias voltage, a first bit line voltage and a second bit line voltage via the bias line, the first bit line and the second bit line respectively. The control circuit shorts the first bit line and the second bit line to program the two memory cells simultaneously during a programming period and generates a random number bit according the statuses of the two memory cells during a reading period.

9 Claims, 12 Drawing Sheets

(51) Int. Cl.

| | | |
|---|---|---|
| *H01L 23/522* | (2006.01) | |
| *H01L 27/088* | (2006.01) | |
| *H01L 29/06* | (2006.01) | |
| *G11C 16/14* | (2006.01) | |
| *H01L 27/11507* | (2017.01) | |
| *H01L 27/11529* | (2017.01) | |
| *H01L 29/423* | (2006.01) | |
| *G06F 7/58* | (2006.01) | |
| *G11C 17/16* | (2006.01) | |
| *G11C 17/18* | (2006.01) | |
| *G11C 16/04* | (2006.01) | |
| *H01L 27/11558* | (2017.01) | |
| *H01L 29/78* | (2006.01) | |

(52) U.S. Cl.
CPC .............. *G11C 16/14* (2013.01); *G11C 17/16* (2013.01); *G11C 17/18* (2013.01); *H01L 23/5226* (2013.01); *H01L 27/0883* (2013.01); *H01L 27/11507* (2013.01); *H01L 27/11529* (2013.01); *H01L 27/11558* (2013.01); *H01L 29/0653* (2013.01); *H01L 29/42328* (2013.01); *H01L 29/42344* (2013.01); *H01L 29/42352* (2013.01); *H01L 29/7841* (2013.01); *G11C 2216/10* (2013.01); *H01L 29/7831* (2013.01); *H01L 29/7833* (2013.01)

(58) Field of Classification Search
USPC .......................................................... 365/96
See application file for complete search history.

(56) References Cited

U.S. PATENT DOCUMENTS

| | | | |
|---|---|---|---|
| 2010/0202183 A1* | 8/2010 | Kurjanowicz | ......... G11C 17/16 365/94 |
| 2013/0077377 A1* | 3/2013 | Kim | ....... G11C 17/08 365/104 |
| 2015/0278551 A1 | 10/2015 | Iyer | |
| 2015/0301802 A1* | 10/2015 | Katoh | ....... G06F 5/01 708/190 |

FOREIGN PATENT DOCUMENTS

| JP | 2014-21529 A | 2/2014 |
|---|---|---|
| JP | 2017-41295 A | 2/2017 |

* cited by examiner

RANDOM NUMBER GENERATOR DEVICE AND CONTROL METHOD THEREOF

CROSS REFERENCE TO RELATED APPLICATIONS

This application claims the benefit of U.S. Provisional Application No. 62/322,237, filed on Apr. 13, 2016, the contents of which are incorporated herein in their entirety.

BACKGROUND OF THE INVENTION

1. Field of the Invention

The invention relates to a random number generator device and a control method thereof. More particularly, the invention relates to a random number generator device having a physically unclonable function (PUF) and a method for controlling the random number generator device.

2. Description of the Prior Art

Recently, electronic apparatuses have become more and more important to people's daily life. For some purposes, an electronic apparatus needs to be provided with an identification. The identification must be the same whenever the identification is requested, and can be used in encoding and/or decoding operations, like a PUF (physically unclonable function) in security applications. Moreover the electronic apparatus sometimes needs one or more random number codes for various applications. Thus how to provide the identification code and the random number codes is an important issue in the art.

SUMMARY OF THE INVENTION

According to an exemplary embodiment, a random number generator device is disclosed. The random number generator device includes at least a bias line, at least a first bit line, at least a second bit line, at least a memory unit, a voltage generator, and a control circuit. Each memory unit includes two memory cells, one of the two memory cells is coupled to the bias line and the first bit line, and the other memory cell is coupled to the bias line and the second bit line. The voltage generator is coupled to the bias line, the first bit line and the second bit line. The voltage generator programs the two memory cells by applying a bias voltage to the bias line and applying a bit line voltage to the first bit line and the second bit line. The control circuit is coupled to the first bit line and the second bit line and provides the two memory cells a bias voltage, a first bit line voltage and a second bit line voltage via the bias line, the first bit line and the second bit line respectively. The control circuit is coupled to the first bit line, the second bit line and the voltage generator, and is configured to program the two memory cells simultaneously and short the first bit line and the second bit line during a programming period and to generate a random number bit according the statuses of the two memory cells during a reading period.

According to another exemplary embodiment, a control method of a random number generator device is disclosed. The random number generator device includes at least a bias line, at least a first bit line, at least a second bit line, and at least a memory unit. Each memory unit includes two memory cells, one of the two memory cells is coupled to the bias line and the first bit line, and the other memory cell is coupled to the bias line and the second bit line. The voltage generator is coupled to the bias line, the first bit line and the second bit line. The control method includes applying a bias voltage to the bias line and applying a bit line voltage to the first bit line and the second bit line to program the two memory cells, and generating a random number bit according to the statuses of the two memory cells during a reading period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
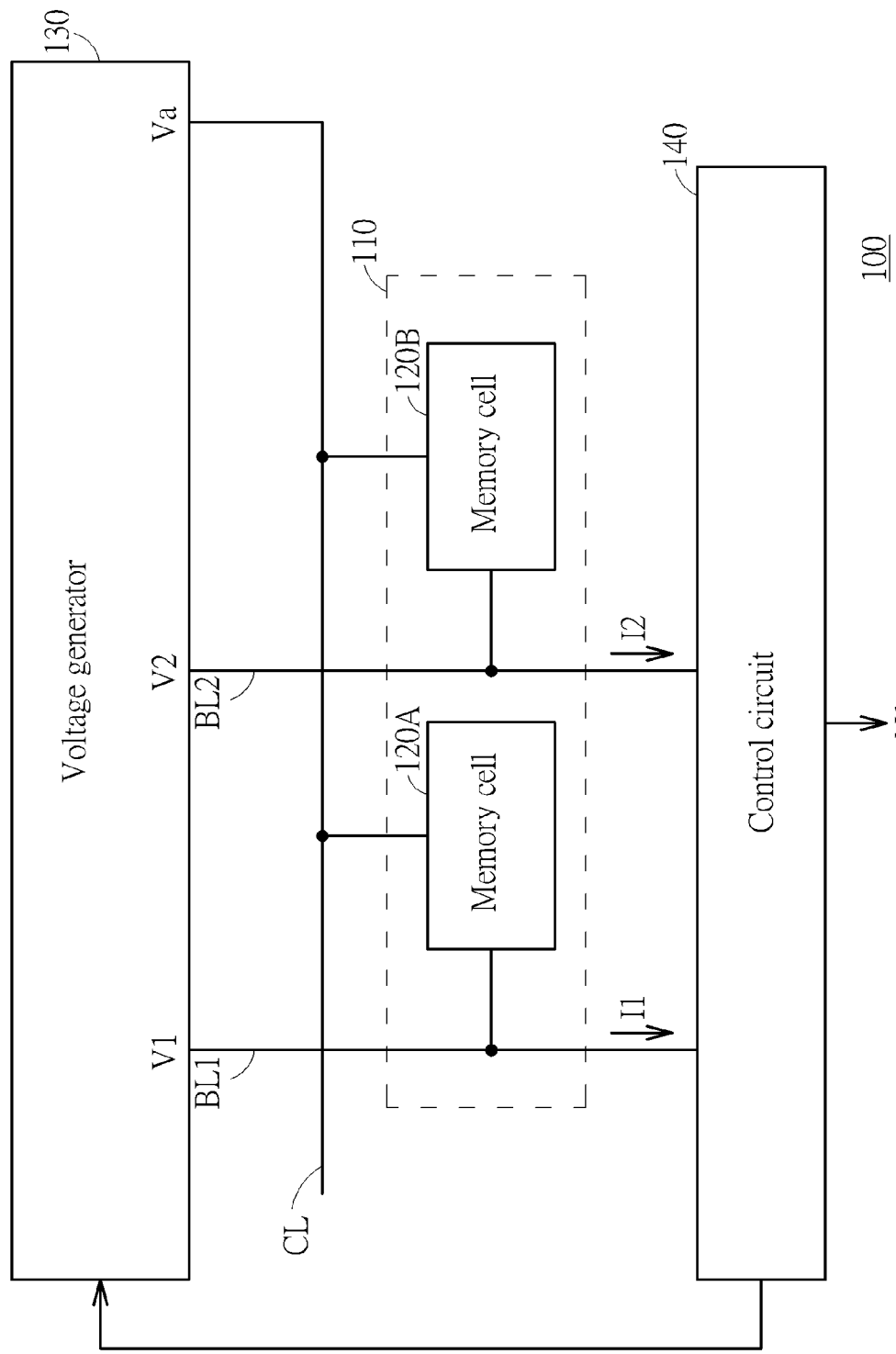
FIG. 1 is a functional block diagram showing a random number generator device according to a first embodiment of the present invention.

Please refer to FIG. 1. FIG. 1 is a functional block diagram showing a random number generator device 100 according to a first embodiment of the present invention. The random number generator device 100 comprises at least a memory unit 110. Although only one memory unit 110 is illustrated in FIG. 1, the random number generator device 100 may comprise two or more memory units 110. Each memory unit 110 could be programmed to generate a random number bit N1. The random number generator device 100 further comprises a voltage generator 130 and a control circuit 140. Each memory unit 110 is coupled to the voltage generator 130 and the control circuit 140. Each memory unit 110 comprises two memory cells 120A and 120B. The memory cell 120A is coupled to a bit line BL1 and a bias line CL, and the memory cell 120B is coupled to another bit line BL2 and the bias line CL. In this disclosure, the bias line CL may be a word line, a programming line or a source line of the random number generator device 100, and a bias voltage Va applied to the bias line CL may be a word line voltage, a programming line voltage or a source line voltage.

The control circuit 140 determines the operation of the memory unit 110 (e.g., program/read) and the voltage generator 130 provides at least a bit line voltage V1, a bit line voltage V2 and the bias voltage Va to the memory unit 110 according the determined result of the control circuit 140. The bit line voltage V1, the bit line voltage V2 and the bias voltage Va are respectively applied to the bit line BL1, the bit line BL2 and the bias line CL.

Figure 2:
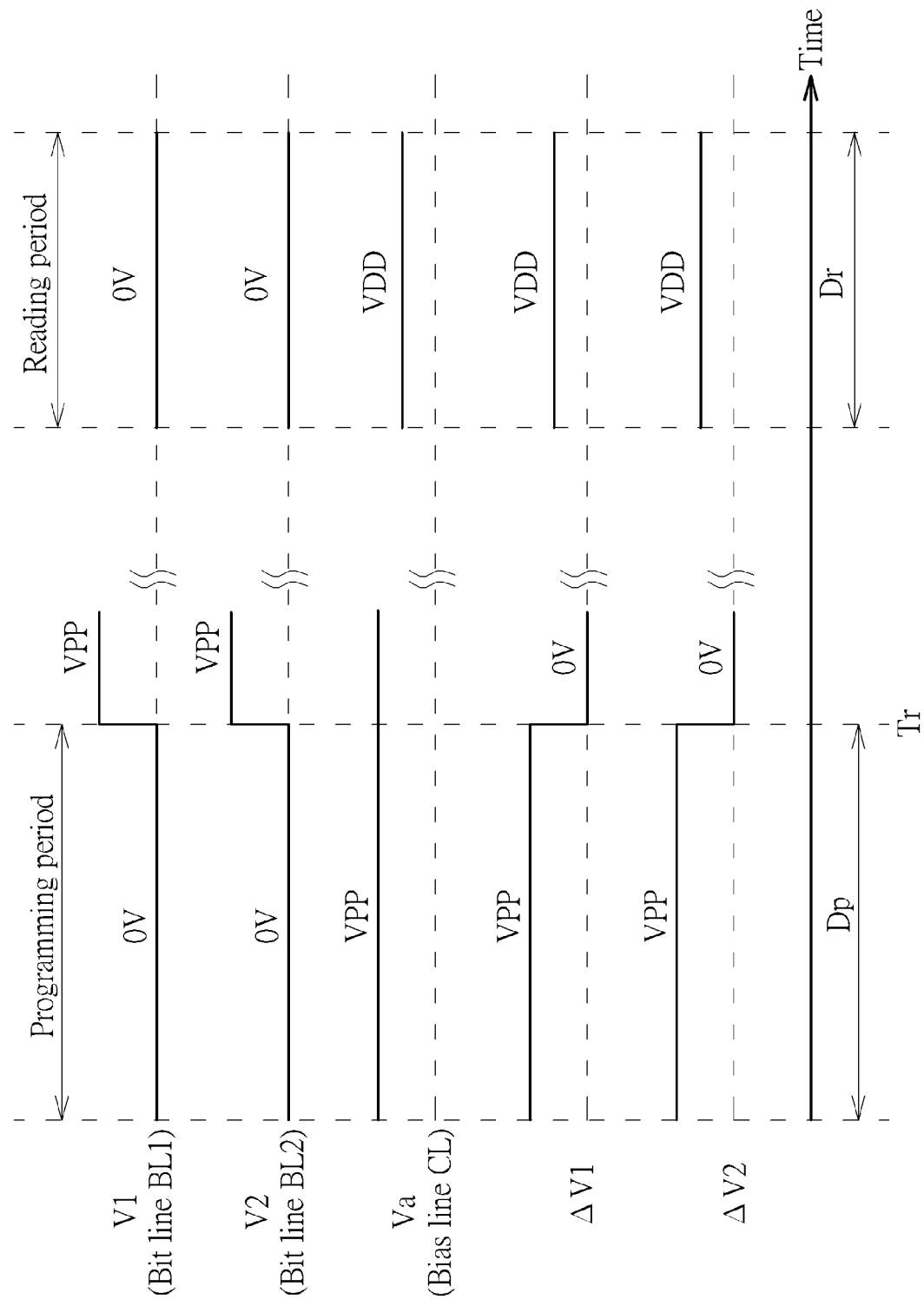
FIG. 2 is a timing diagram of the random number generator device shown in FIG. 1.

Please refer to FIG. 2 and FIG. 1. FIG. 2 is a timing diagram of the random number generator device 100. During a programming period Dp, the control circuit 140 may short the bit line BL1 and the bit line BL2 and provide a programming voltage to the bias line CL. In other words, the two memory cells 120A and 120B of the memory unit 110 are being programmed simultaneously. Accordingly, when the voltage generator 130 provides corresponding voltages of program operation to the memory unit 110 via the bit line BL1, the bit line BL2 and the bias line CL, the voltage level of the bit line voltage V1 is equal to that of the bit line voltage V2. In an embodiment, the bit line voltage V1, the bit line voltage V2 and the bias voltage Va may be respectively equal to 0V (i.e., grounded), 0V and a programming voltage VPP.

When the program operation of the memory unit 110 is finished, the electrical characteristic (e.g., conductivity or threshold voltage) of the programmed memory cell is changed. However, due to intrinsic fabrication process variations between the two memory cells 120A and 120B (such as the gate oxide thickness uniformity, gate oxide defect, pin hole and local oxide thinning etc.), only one of the two memory cells 120A and 120B is completely programmed. In other words, when programming the two memory cells 120A and 120B simultaneously, programming operation may be stopped immediately once one of the two memory cells 120A and 120B is completely programmed. The reason why only one of the two memory cells 120A and 120B is completely programmed is described hereinafter.

Before programming the two memory cells 120A and 120B, both of the two memory cells 120A and 120B are not conductive. Although the memory cells 120A and 120B are applied with corresponding program voltages simultaneously, due to intrinsic fabrication process variations between the two memory cells 120A and 120B, one of the two memory cells 120A and 120B is programmed first, the first programmed memory cell becomes conductive while the other memory cell is still non-conductive. Therefore, when one of the two memory cells 120A and 120B is programmed and becomes conductive, the bias line CL would be electrically connected to the corresponding bit line BL1 or BL2 via the conductive memory cell 120A or 120B, and the voltage level of the corresponding bit line voltage V1 or V2 would be varied towards the voltage level of the bias voltage Va due to the electrical connection between the bias line CL and the corresponding bit line BL1 or BL2. For example, if the memory cell 120A has finished programming and becomes conductive, the bias line CL would be electrically connected to the bit line BL1 via the memory cell 120A, and the voltage level of the bit line voltage V1 is varied towards the voltage level of the bias voltage Va due to the electrical connection between the bias line CL and the corresponding bit line BL1. Similarly, if the memory cell 120B has finished programming and becomes conductive, the bias line CL would be electrically connected to the bit line BL2 via the memory cell 120B, and the voltage level of the bit line voltage V2 is varied towards the voltage level of the bias voltage Va due to the electrical connection between the bias line CL and the corresponding bit line BL2.

In the embodiment, since the control circuit 140 may short the bit line BL1 to the bit line BL2 during the programming period Dp, the voltage levels of the bit line voltages V1 and V2 would vary simultaneously. Accordingly, the voltage difference ΔV1 between the bias line CL and the bit line BL1 and the voltage difference ΔV2 between the bias line CL and the bit line BL2 would vary simultaneously as well. Referring to FIG. 2, at time point Tr, one of the two memory cells 120A and 120B is completely programmed while the other one is not completely programmed. Since one of the two memory cells 120A and 120B has been completely programmed and becomes conductive at time point Tr, electrical connections between the bias line CL and the bit lines BL1 and BL2 are established and the voltage differences ΔV1 and ΔV2 are decreased. Since the voltage differences ΔV1 and ΔV2 are decreased, the voltage difference ΔV1 between the bias line CL and the bit line BL1 and the voltage difference ΔV2 between the bias line CL and the bit line BL2 would be insufficient to continue programming the memory cells 120A and 120B. Accordingly, programming operation of the two memory cells 120A and 120B is stopped immediately at time point Tr, such that one of the two memory cells 120A and 120B has finished programming while the other has not. At this time Tr, the bit line BL1 and bit line BL2 may no longer be shorted.

Therefore, the programmed probability of the two memory cells 120A and 120B are determined according to the intrinsic fabrication process variations of the two memory cells 120A and 120B so as to make the programmed statuses of the two memory cells 120A and 120B different. Therefore, by controlling the programming of the two memory cells 120A and 120B, a random number bit N1 would be generated and determined according to process variations which results in different programmed statuses of the two memory cells 120A and 120B.

Once one of the two memory cells 120A and 120B has been programmed, the random number bit N1 is recorded into the memory unit 110 and could be accessed. Please refer to FIGS. 1 and 2 again. The random number bit N1 could be read during a reading period Dr. During the reading period Dr, the control circuit 140 controls the voltage generator 130 to provide corresponding read voltages (i.e., V1, V2 and Va) to the memory unit 110. Moreover, the bit line BL1 and the bit line BL2 are electrically disconnected during the reading period Dr. Under the reading voltages provided by the voltage generator 130, a cell current I1 and a cell current I2 respectively correspondent to the memory cell 120A and 120B are compared by the control circuit 140 to produce the random number bit N1.

More in detail, before the reading period Dr, all the bit lines (e.g., BL1 and BL2) of the memory units 110 of the random number generator 100 are pre-charged to a high voltage firstly. During the reading period Dr, the voltage level of the bias voltage Va would be equal to a device voltage VDD and the two bit lines BL1 and BL2 are reset to a ground voltage to generate the cell current I1 and the cell current I2 respectively correspondent to the memory cell 120A and 120B. The control circuit 140 may sense and amplify the signals of the two bit lines BL1 and BL2 (e.g., the cell current I1 and the cell current I2) to determine the value of the random number bit N1 For example, the value of the random number bit N1 may be determined as 1 if the memory cell 120A has completed programming while the memory cell 120B has not (e.g., I1>I2), and the value of the random number bit N1 may be determined as 0 if the memory cell 120A has not completed programming while the memory cell 120B has (e.g., I1<I2).

Furthermore, an alternative reading operation of the random number generator device is described below. Before the reading period Dr, all the bit lines of the memory units of the random number generator 100 are pre-charged to a high voltage firstly. During the reading period Dr, the voltage level of the bias voltage Va would be equal to a device voltage VDD, the two bits lines BL1 and BL2 of the selected memory unit 110 are reset to the ground voltage and then disconnected from any power as floating nodes. The two memory cells begin to precharge. The statuses of the memory cells affect the precharge condition. Thus after a predetermined time, the statuses of the two memory cells are determined according to voltage levels of the bit lines BL1 and BL2. The control circuit 140 may sense and amplify the signals of the two bit lines BL1 and BL2 (e.g., the voltage levels of the bits line BL1 and BL2) to determine the value of the random number bit N1.

Figure 3:
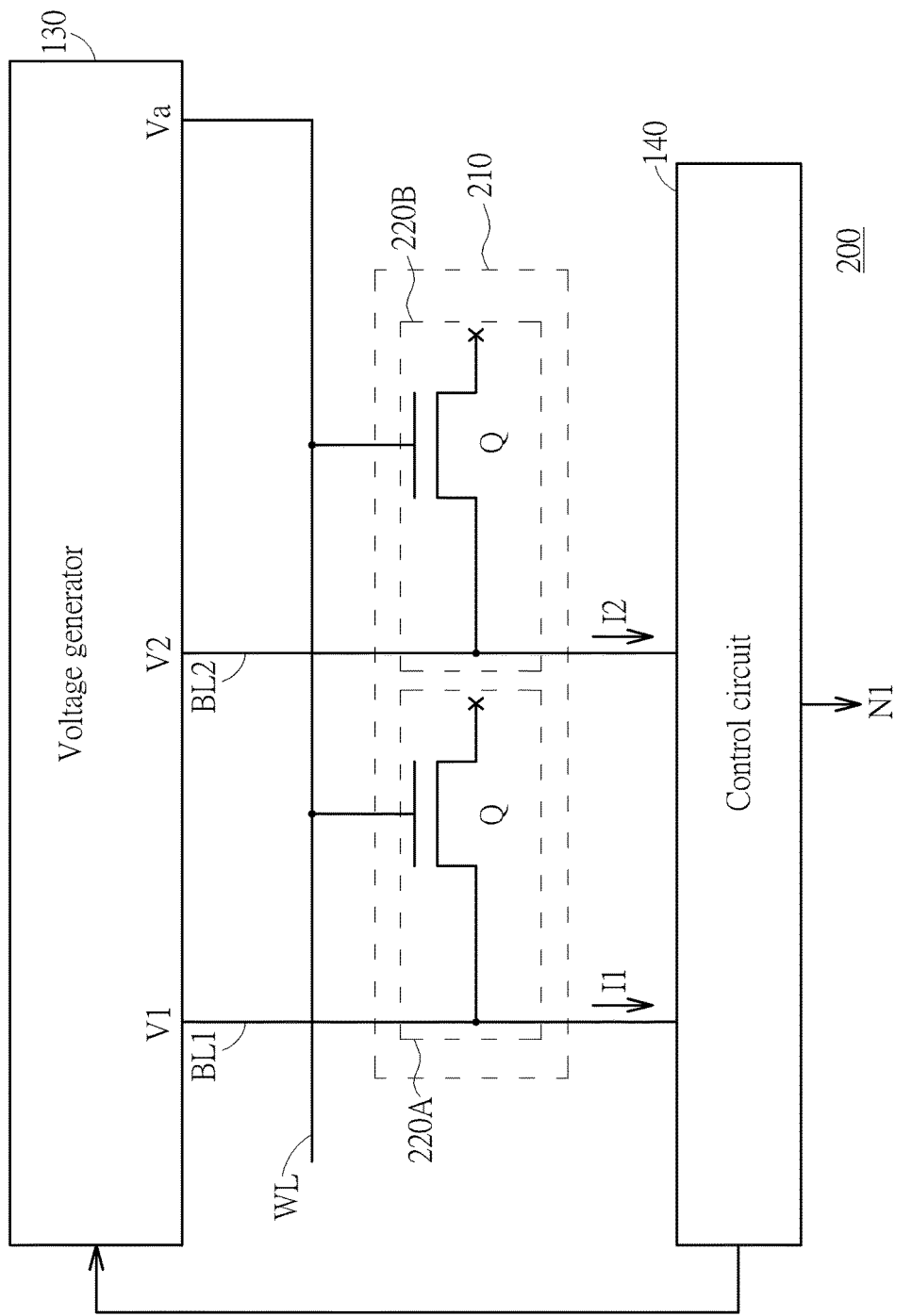
FIG. 3 is a functional block diagram showing a random number generator device according to a second embodiment of the present invention.

Please refer to FIG. 3. FIG. 3 is a functional block diagram showing a random number generator device 200 according to a second embodiment of the present invention. The random number generator device 200 also comprises at least a memory unit 210, the voltage generator 130 and the control circuit 140. The difference between FIG. 1 and FIG. 3 is that the memory unit 110 of FIG. 1 is replaced with the memory unit 210 of FIG. 3. Each memory unit 210 comprises two memory cells 220A and 220B, and each of the memory cells 220A and 220B is a one-transistor (1T) antifuse one-time programmable (OTP) cell that comprises a transistor Q. The memory cell 220A is coupled to the bit line BL1 and a word line WL, and the memory cell 220B is coupled to the bit line BL2 and the word line WL. In the embodiment, the word line WL is used as the bias line CL shown in FIG. 1, and the bias voltage Va is used as a word line voltage.

Figure 4:
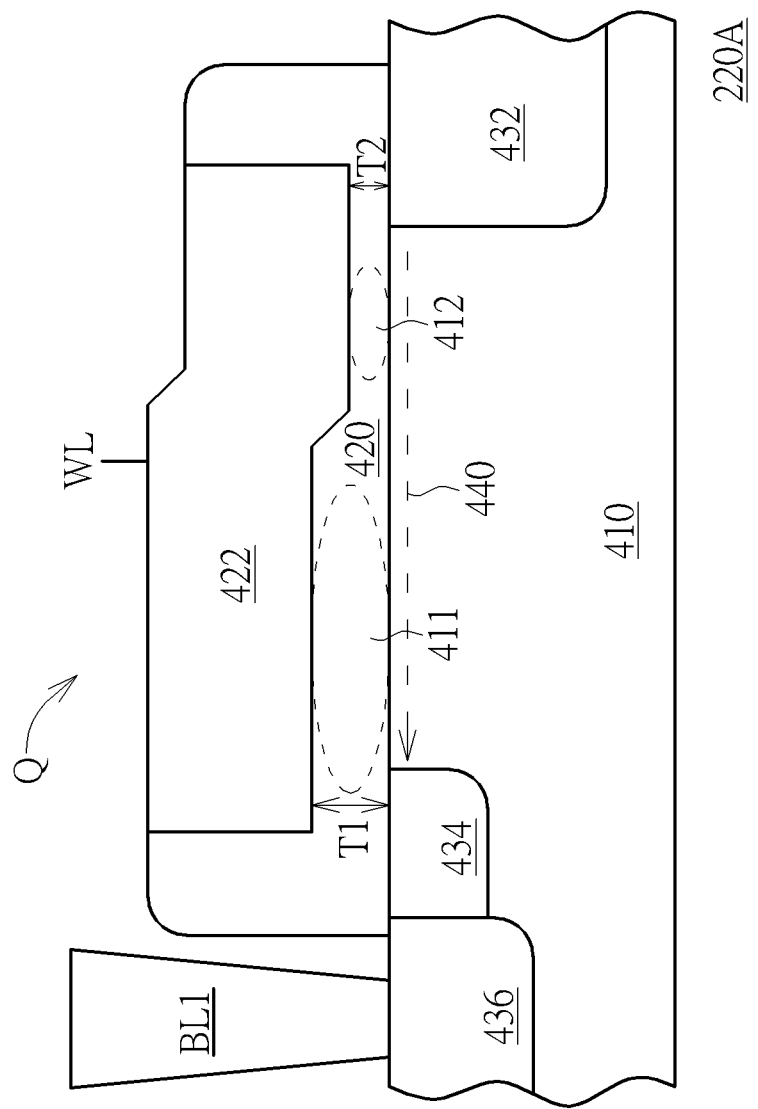
FIG. 4 is a diagram showing a structure of the memory cell of the random number generator device shown in FIG. 3.

Please refer to FIG. 4. FIG. 4 is a diagram showing a structure of the memory cell 220A of the random number generator device 200. A gate 422 of the transistor Q is coupled to the word line WL, a gate oxide layer 420 of the transistor Q is formed between the gate 422 and a substrate 410, a channel 440 is formed between a shallow trench isolation (STI) 432 and a lightly doped drain (LDD) 434, and the bit line BL1 is coupled to a highly doped drain 436. The gate oxide layer 420 comprises a thick oxide region 411 and a thin oxide region 412 formed below the gate 422. The thickness T1 of the thick oxide region 411 is greater than the thickness T2 of the thin oxide region 412, and the distance between the thick oxide region 411 and the bit line BL1 is less than the distance between the thin oxide region 412 and the bit line BL1. When a sufficiently large programming voltage VPP is applied to the gate 422 via the word line WL, the oxide of the thin oxide region 412 would be ruptured, forming a conductive path and finishing programming the memory cell 220A. The structure and operation of the memory cell 220B are similar to the memory cell 220A and thus are not reiterated herewith.

Moreover, the random number bit N1 of the random number generator device 200 is generated (programmed) and may be read based on similar operations of applying related voltages shown in FIG. 2 and will not be redundantly described.

Figure 5:
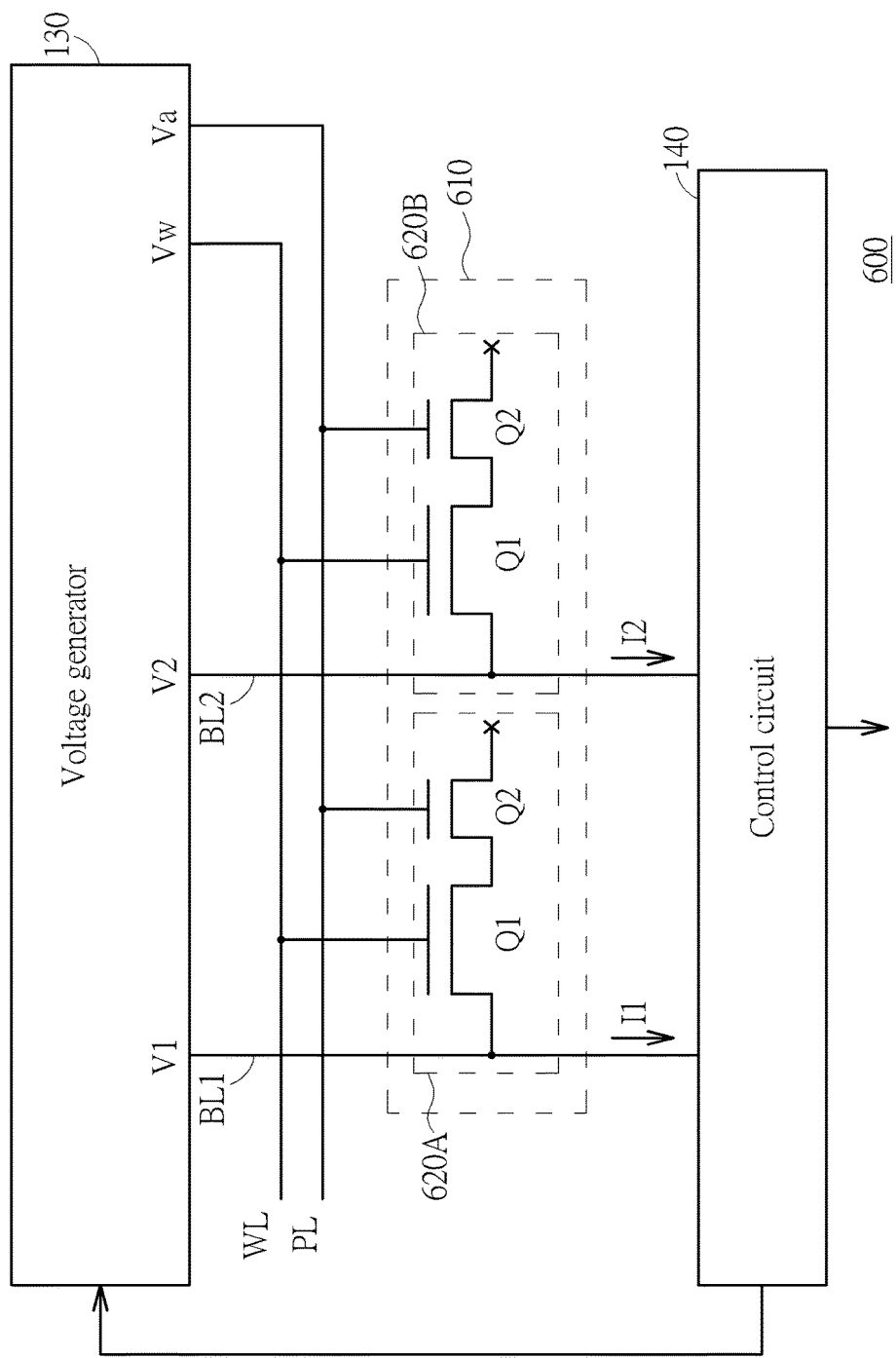
FIG. 5 is a functional block diagram showing a random number generator device according to a third embodiment of the present invention.

Please refer to FIG. 5. FIG. 5 is a functional block diagram showing a random number generator device 600 according to a third embodiment of the present invention. The random number generator device 600 also comprises at least a memory unit 610, the voltage generator 130 and the control circuit 140. In the embodiment, each memory unit 610 comprises two memory cells 620A and 620B, and each of the memory cells 620A and 620B is a two-transistor (2T) antifuse one-time programmable (OTP) cell that comprises a first transistor Q1 and a second transistor Q2. A gate oxide layer of the second transistor Q2 may be, but is not limited to, thinner than a gate oxide layer of the first transistor Q1. In another embodiment, the thickness of the gate oxide layer of the second transistor Q2 is equal to the thickness of the gate oxide layer of the first transistor Q1. A gate of the first transistor Q1 is coupled to the word line WL, and a gate of the second transistor Q2 is coupled to a programming line PL. A first end of the first transistor Q1 is coupled to the bit line BL1 or BL2, a second end of the first transistor Q1 of the memory cell 620A is coupled to a first end of the second transistor Q2, and a second end of the second transistor Q2 is floating. In the embodiment, the programming line PL is used as the bias line CL shown in FIG. 1, and the bias voltage Va applied to the programming line PL is used as a programming line voltage.

Figure 6:
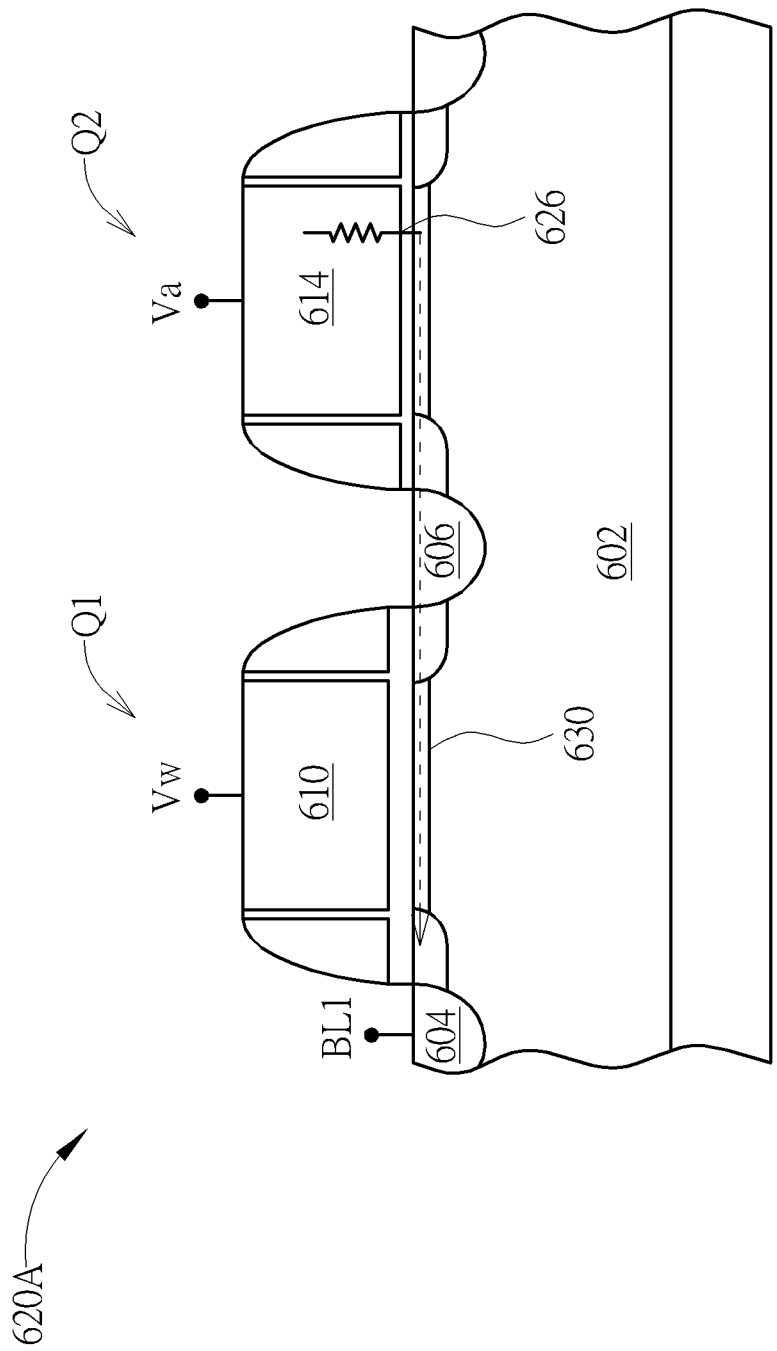
FIG. 6 is a diagram showing a structure of the memory cell of the random number generator device shown in FIG. 5.
Figure 7:
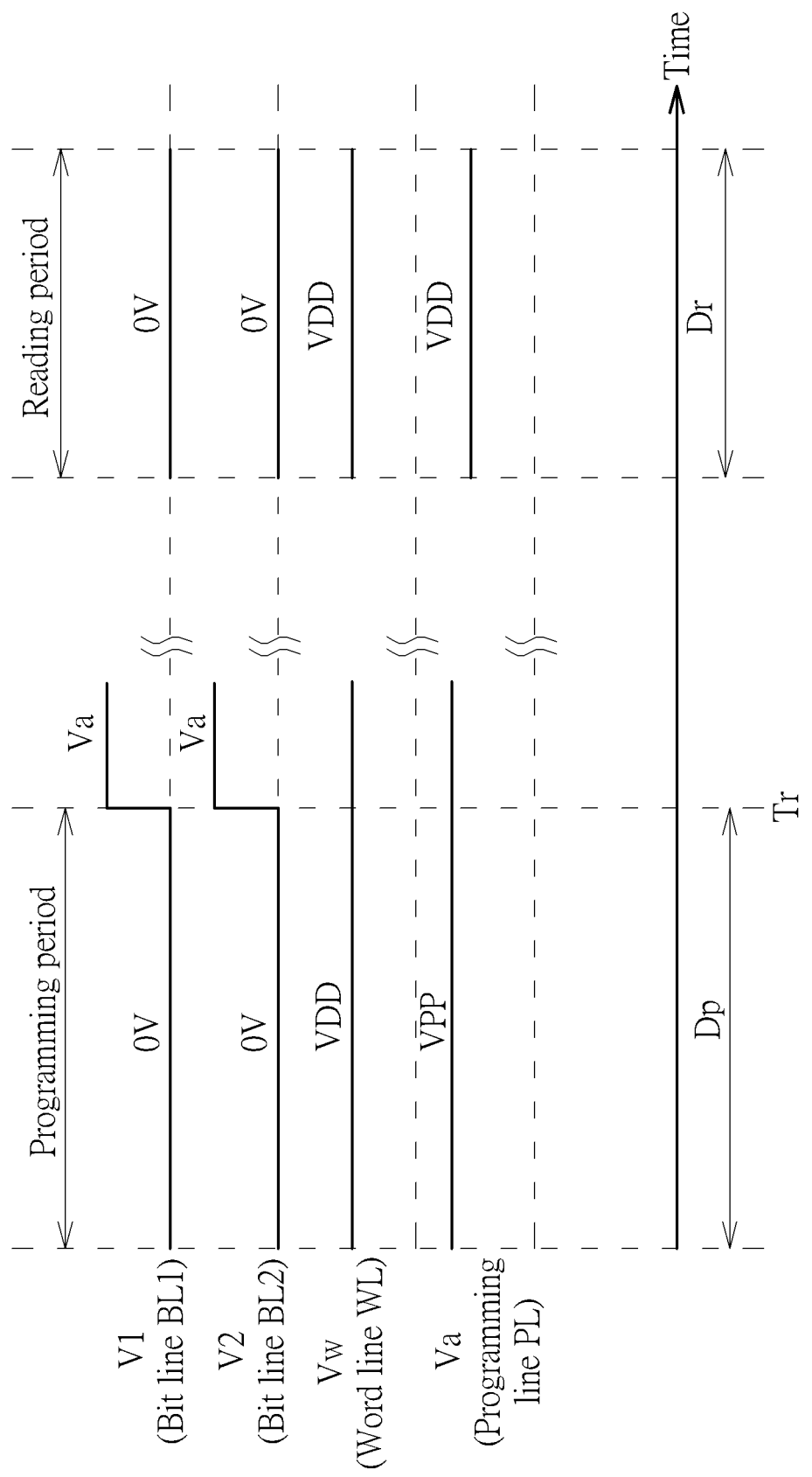
FIG. 7 is a timing diagram of the random number generator device shown in FIG. 5.

Please refer to FIGS. 6 and 7. FIG. 6 is a diagram showing a structure of the memory cell 620A of the random number generator device 600. FIG. 7 is a timing diagram of the random number generator device 600. During the programming period Dp, a word line voltage Vw is applied to a select gate 610 of the first transistor Q1 and the bit line voltage V1 is applied to a first doped region 604 which is connected to the first bit line BL1. In this way, a first channel region 630 is formed under the select gate 610 and the bit line voltage V1 is coupled to a second doped region 606 such that the voltage level of the second doped region 606 approaches the bit line voltage V1. During the programming period Dp, the programming line voltage Va is further applied to a gate 614 of the second transistor Q2. The voltage difference ΔV1 between the gate 614 and the second doped region 606 causes an oxide layer between the gate 614 and the well region 602 to rupture such that the oxide layer becomes ruptured and the memory cell 620A is completely programmed. In this way, a permanent conducting path 626 can be formed. The bit line voltage V1 could be a ground voltage, and in a preferred embodiment, the programming line voltage Va could be twice to five times as great as the word line voltage Vw. After the memory cell 620A is completely programmed (i.e., ruptured), the memory cell 620A becomes conductive due to the conducting path 626 formed between the gate 614 and the well region 602. The structure and operation of the memory cell 620B are similar to the memory cell 620A and thus are not reiterated herewith.

Please refer to FIGS. 5 and 7 again. The control circuit 140 controls the voltage generator 130 to provide a same voltage difference to the memory cells 620A and 620B simultaneously during the programming period Dp. In other words, the control circuit 140 may short the bit line BL1 and the bit line BL2 during the programming period Dp. Accordingly, the memory unit 610 of the random number generator device 600 is being programmed, the voltage level of the bit line voltage V1 is equal to that of the bit line voltage V2. Before programming the two memory cells 620A and 620B, both of the two memory cells 620A and 620B are not ruptured (i.e., non-conductive). Although the memory cells 620A and 620B are applied with corresponding program voltages simultaneously, due to intrinsic fabrication process variations between the two memory cells 620A and 620B, one of the two memory cells 620A and 620B is programmed first, the first programmed memory cell becomes conductive while the other memory cell is still non-conductive. Therefore, when one of the two memory cells 620A and 620B is completely programmed and becomes conductive, the gate over the ruptured oxide layer would be electrically connected to the corresponding bit line BL1 or BL2 via the conductive memory cell 620A or 620B, and the voltage level of the corresponding bit line voltage V1 or V2 would be varied towards the voltage level of the programming line voltage Va due to the electrical connection between the gate over the ruptured oxide layer and the corresponding bit line BL1 or BL2. That is to say, once one of the two memory cells 620A and 620B is completely programmed (i.e., at time point Tr), the programmed memory cell is ruptured and becomes conductive while the other memory cell is still non-conductive. Accordingly, by controlling the programming operations of the two memory cells 620A and 620B, the random number bit N1 would be generated and determined according to the different programmed statuses of the two memory cells 620A and 620B.

Once one of the two memory cells 620A and 620B has been completely programmed, the random number bit N1 is recorded into the memory unit 610 of the random number generator device 600 and could be accessed. Please refer to FIGS. 5 and 7 again. The random number bit N1 could be read during the reading period Dr. During the reading period Dr, the two bit lines BL1 and BL2 are reset to the ground voltage, and the voltage levels of the word line voltage Vw and the program line voltage Va would be equal to the device voltage VDD. The control circuit 140 may sense and amplify the signals of the two bit lines BL1 and BL2 to determine the value of the random number bit N1. The detail of reading operation is similar to FIG. 2 and thus is not redundant described.

Figure 8:
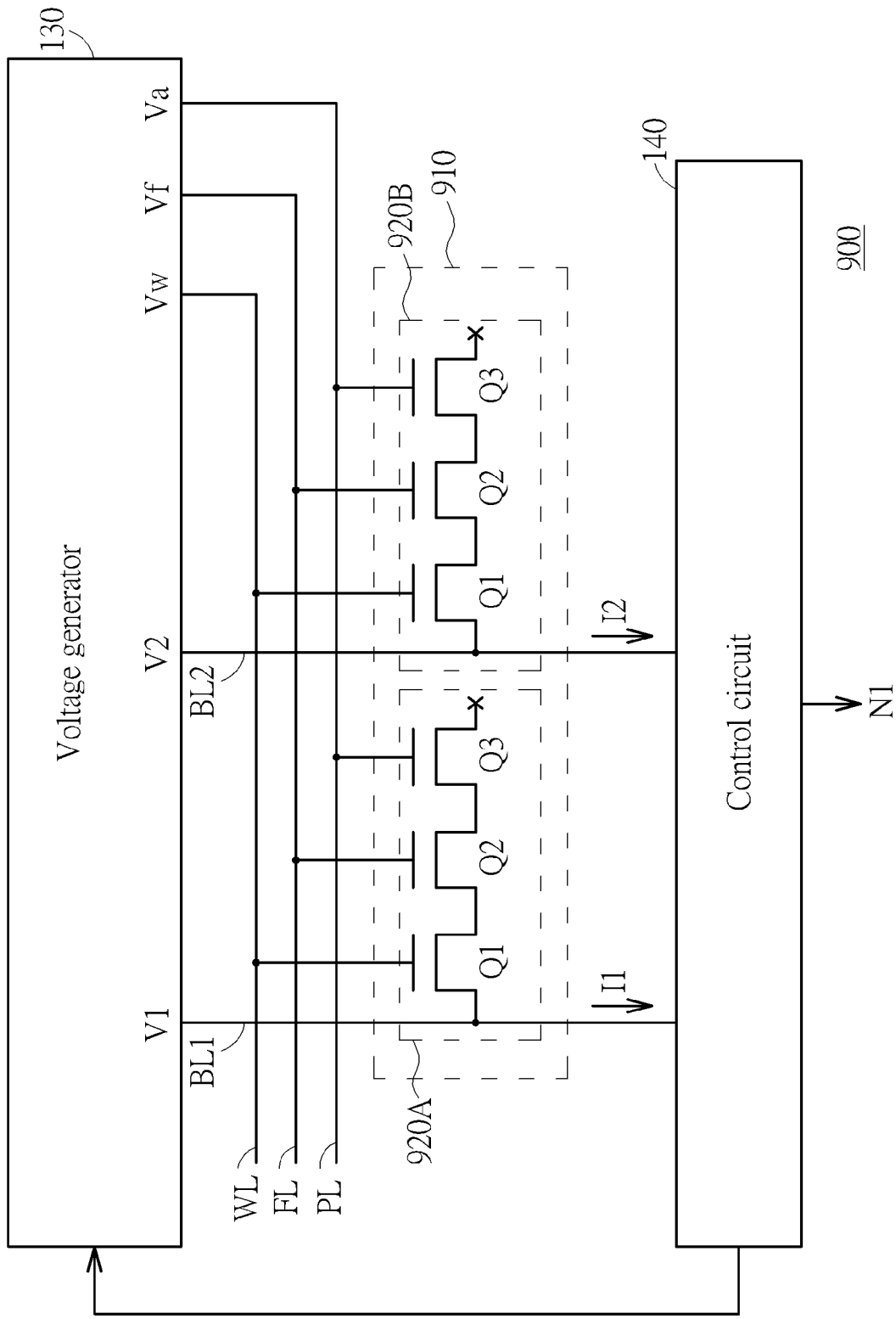
FIG. 8 is a functional block diagram showing a random number generator device according to a fourth embodiment of the present invention.

Please refer to FIG. 8. FIG. 8 is a functional block diagram showing a random number generator device 900 according to a fourth embodiment of the present invention. The random number generator device 900 also comprises at least a memory unit 910, the voltage generator 130 and the control circuit 140. In the embodiment, each memory unit 910 comprises two memory cells 920A and 920B, and each of the memory cells 920A and 920B is a three-transistor (3T) antifuse one-time programmable (OTP) cell that comprises a first transistor Q1, a second transistor Q2 and a third transistor Q3. A gate oxide layer of the third transistor Q3 may be, but not limited to, thinner than a gate oxide layer of the first transistor Q1 and a gate oxide layer of the second transistor Q2. In another embodiment, the thickness of the gate oxide layer of the second transistor Q3 is equal to the thicknesses of the gate oxide layers of the first transistor Q1 and the second transistor Q2. A gate of the second transistor Q2 is coupled to a following line FL for receiving a following voltage Vf from the voltage generator 130. The major difference between the random number generator device 900 shown in FIG. 8 and the random number generator device 600 shown in FIG. 5 is that the second transistor Q2 of each memory cell of the random number generator device 900 is used a following transistor to relax the voltage stress between the first transistor Q1 and the third transistor Q3, and that the third transistor Q3 of the random number generator device 900 is used as the second transistor Q2 of the random number generator device 600. In other words, when one of the two memory cells 920A and 920B is completely programmed, an oxide layer of the programmed memory cell 920A or 920B is ruptured.

Figure 9:
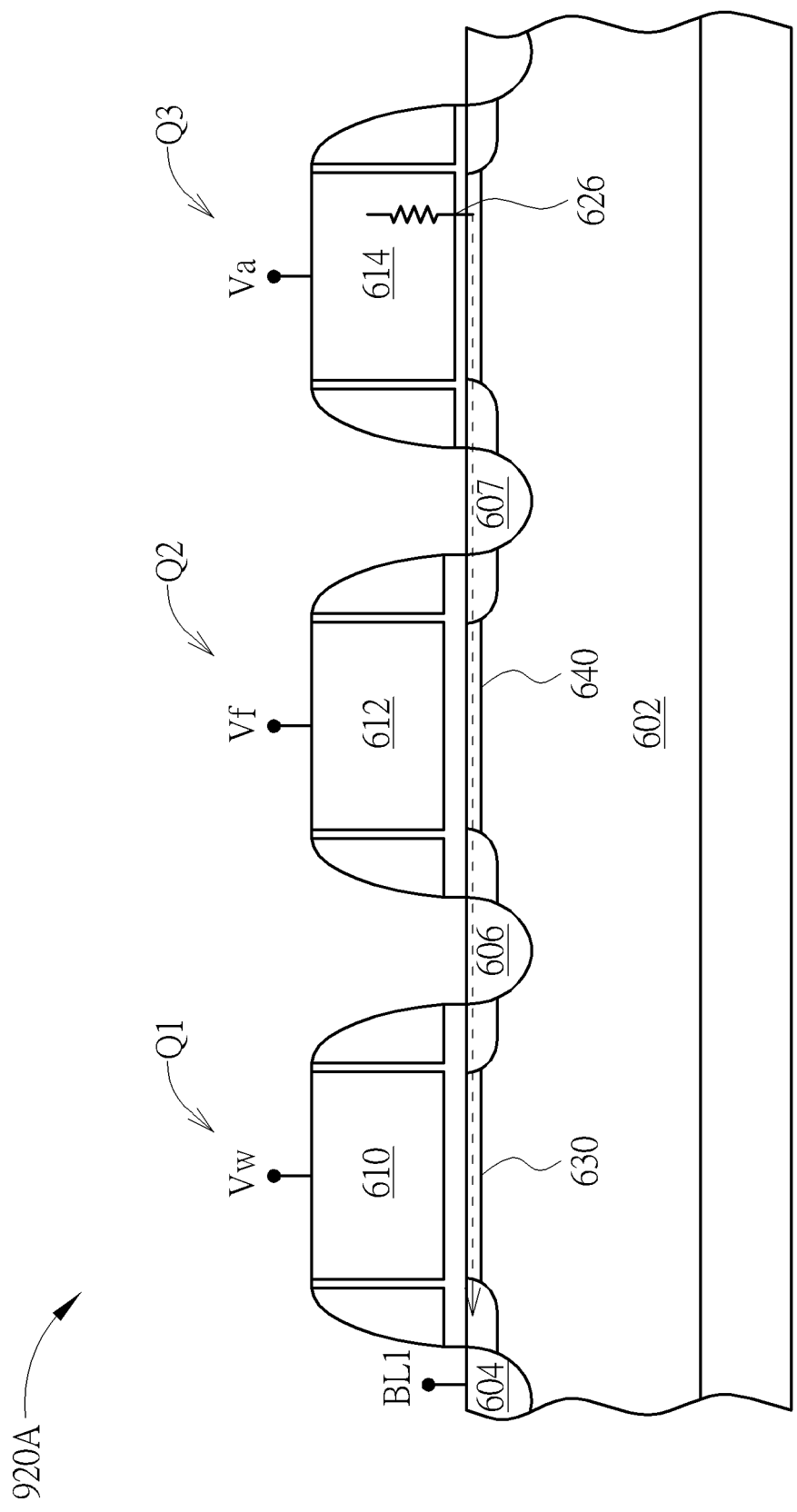
FIG. 9 is a diagram showing a structure of the memory cell of the random number generator device shown in FIG. 8.
Figure 10:
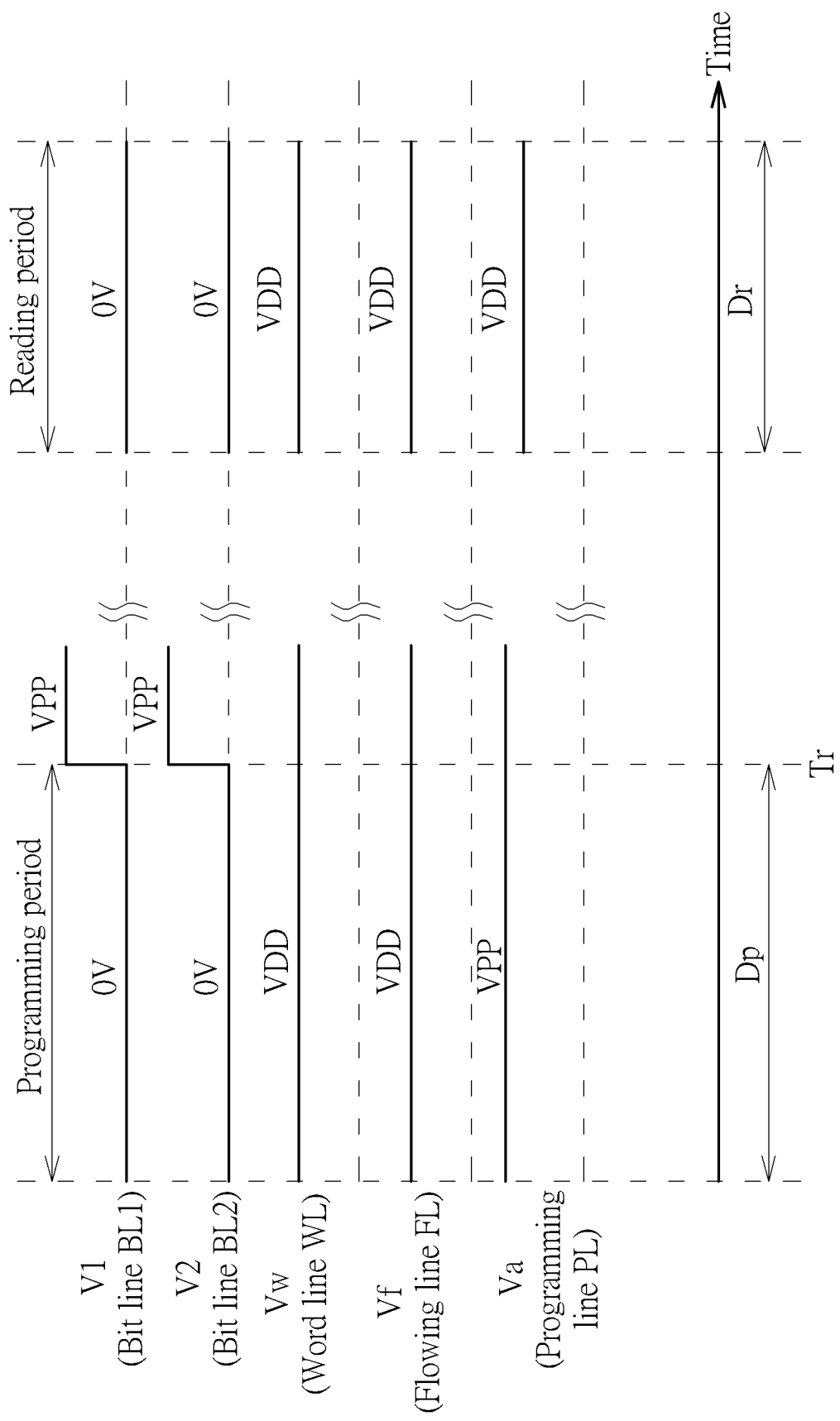
FIG. 10 is a timing diagram of the random number generator device shown in FIG. 8.

Please refer to FIGS. 9 and 10. FIG. 9 is a diagram showing a structure of the memory cell 920A of the random number generator device 900. FIG. 10 is a timing diagram of operating the random number generator device 900. During the programming period Dp, the word line voltage Vw is applied to the select gate 610 of the first transistor Q1, the following voltage Vf is applied to a following gate 612 of the second transistor Q2, and the bit line voltage V1 is applied to the first doped region 604. In this way, a first channel region 630 is formed under the select gate 610, a second channel region 640 is formed under the following gate 612, and the bit line voltage V1 is coupled to the second doped region 606 and a third doped region 607 such that the voltage levels of the second doped region 606 and the third doped region 607 approach the bit line voltage V1. During the programming period Dp, the programming line voltage Va is further applied to a gate 614 of the third transistor Q3. The voltage difference ΔV1 between the gate 614 and the third doped region 607 causes the oxide layer between the gate 614 and the well region 602 to rupture such that the oxide layer becomes ruptured and the memory cell 920A is completely programmed. In this way, the permanent conducting path 626 of the third transistor Q3 can be formed. The bit line voltage V1 could be a ground voltage, and in a preferred embodiment, the programming line voltage Va could be twice to five times as great as the word line voltage Vw. After the memory cell 920A is completely programmed (i.e., ruptured), the memory cell 920A becomes conductive due to the conducting path 626 formed between the gate 614 and the well region 602. The structure and operation of the memory cell 920B are similar to the memory cell 920A and thus are not reiterated herewith.

Please refer to FIGS. 8 and 10 again. The control circuit 140 controls the voltage generator 130 to provide a same voltage difference to the memory cells 920A and 920B simultaneously during the programming period Dp. In other words, the control circuit 140 may short the bit line BL1 and the bit line BL2 during the programming period Dp. Accordingly, the memory unit 910 of the random number generator device 900 is being programmed, the voltage level of the bit line voltage V1 is equal to that of the bit line voltage V2. Before programming the two memory cells 920A and 920B, both of the two memory cells 920A and 920B are not ruptured (i.e., non-conductive). Although the memory cells 920A and 920B are applied with corresponding program voltages simultaneously, due to intrinsic fabrication process variations between the two memory cells 920A and 920B, one of the two memory cells 920A and 920B is programmed first, the first programmed memory cell becomes conductive while the other memory cell is still non-conductive. Therefore, when one of the two memory cells 920A and 920B is completely programmed and becomes conductive, the gate over the ruptured oxide layer would be electrically connected to the corresponding bit line BL1 or BL2 via the conductive memory cell 920A or 920B, and the voltage level of the corresponding bit line voltage V1 or V2 would be varied towards the voltage level of the programming line voltage Va due to the electrical connection between the gate over the ruptured oxide layer and the corresponding bit line BL1 or BL2. That is to say, once one of the two memory cells 920A and 920B is completely programmed (i.e., at time point Tr), the programmed memory cell is ruptured and becomes conductive while the other memory cell is still non-conductive. Accordingly, by controlling the programming operations of the two memory cells 920A and 920B, the random number bit N1 would be generated and determined according to the different programmed statuses of the two memory cells 920A and 920B.

Once one of the two memory cells 920A and 920B has been completely programmed by the voltage generator 130, the random number bit N1 is recorded into the memory unit 910 of the random number generator device 900 and could be accessed. Please refer to FIGS. 8 and 10 again. The random number bit N1 could be read during the reading period Dr. During the reading period Dr, the two bit lines BL1 and BL2 are reset to the ground voltage, and the voltage levels of the word line voltage Vw, the following voltage Vf and the program line voltage Va would be equal to the device voltage VDD. The control circuit 140 may sense and amplify the signals of the two bit lines BL1 and BL2 to determine the value of the random number bit N1. The detail of reading operation is similar to FIG. 2 and thus is not redundant described.

Figure 11:
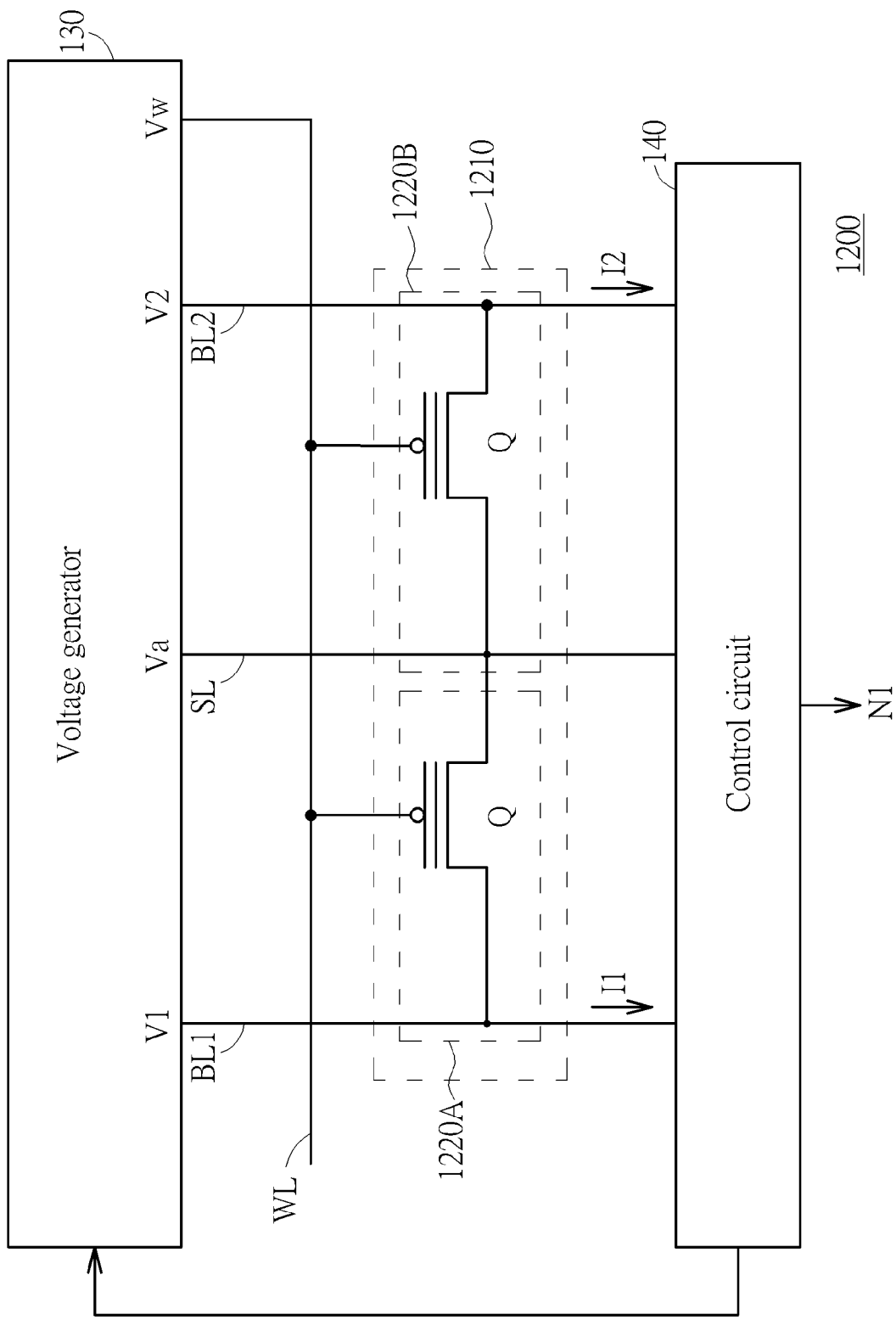
FIG. 11 is a functional block diagram showing a random number generator device according to a fifth embodiment of the present invention.

Please refer to FIG. 11. FIG. 11 is a functional block diagram showing a random number generator device 1200 according to a fifth embodiment of the present invention. The random number generator device 1200 also comprises at least a memory unit 1210, the voltage generator 130 and the control circuit 140. In the embodiment, each memory unit 1210 comprises two memory cells 1220A and 1220B, and each of the memory cells 1220A and 1220B is a flash memory cell that comprises a transistor Q. A control gate of the flash memory cell 1220A or 1220B is coupled to the word line WL, a first end of the flash memory cell 1220A or 1220B is coupled to a corresponding bit line BL1 or BL2, and a second end of the flash memory cell 1220A or 1220B is coupled to a source line SL. In the embodiment, the source line SL is used as a bias line, and the bias voltage Va is used as a source line voltage.

Figure 12:
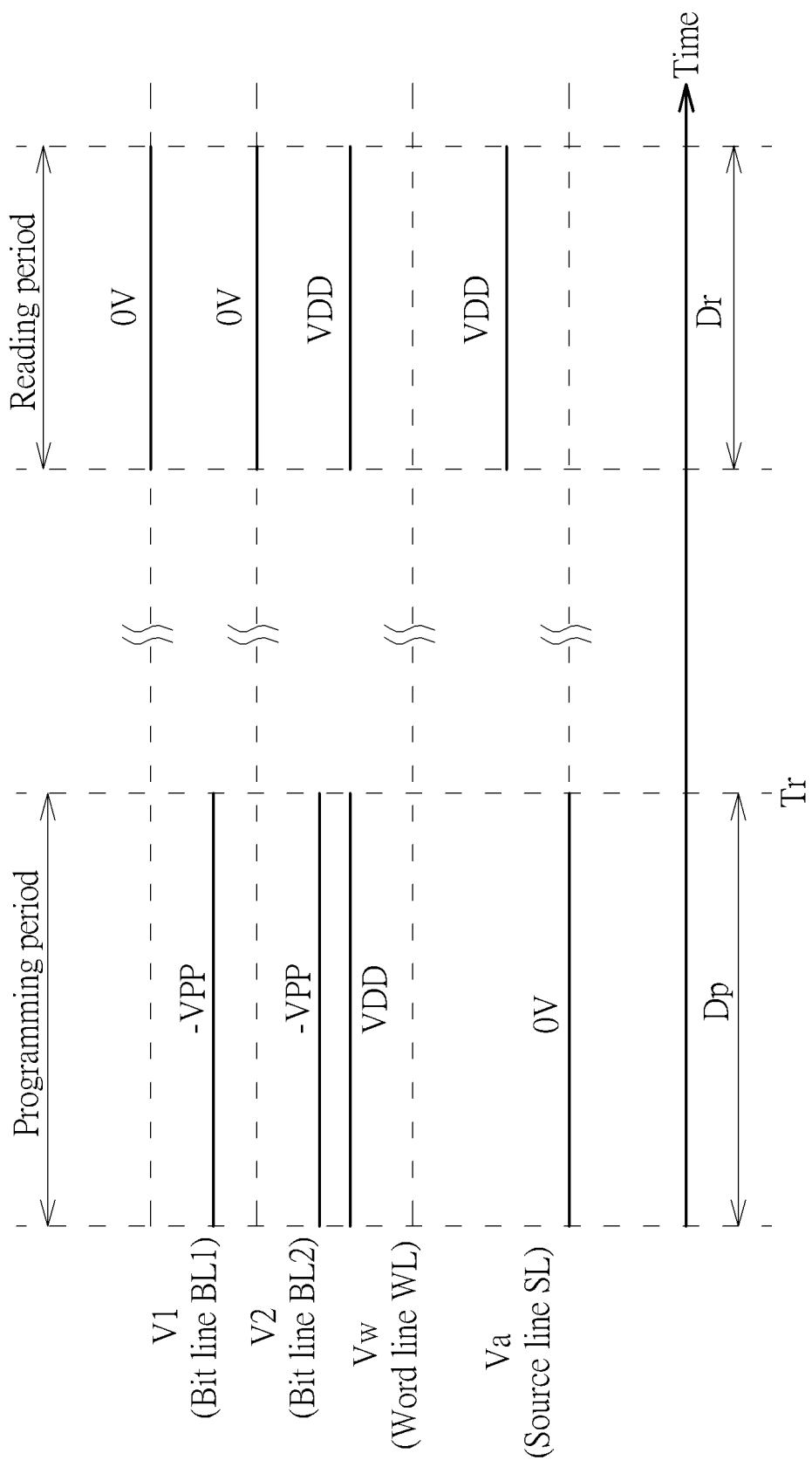
FIG. 12 is a timing diagram of the random number generator device shown in FIG. 11.

Please refer to FIGS. 11 and 12. FIG. 12 is a timing diagram of operating the random number generator device 1200. During the programming period Dp, the bit line voltages V1 and V2 are a negative programming voltage-VPP, the word line voltage Vw is equal to the device voltage VDD, and the bias voltage Va (i.e., the source line voltage) is 0V, such that electrons are injected into a floating gate of the memory cells 1220A and 1220B to change the threshold voltages of the transistors Q of the memory cells 1220A and 1220B. In the embodiment, the control circuit 140 controls the voltage difference between the word line WL and the bit line BL1 and controls the voltage difference between the word line WL and the bit line BL2. In the embodiment, the control circuit 140 may short the bit line BL1 to the bit line BL2 during the programming period Dp. Accordingly, when the memory unit 1210 of the random number generator device 1200 is being programmed, the voltage level of the bit line voltage V1 is equal to that of the bit line voltage V2. Before programming the two memory cells 1220A and 1220B, both of the two memory cells 1220A and 1220B have the same thresholds. However, the two memory cells 1220A and 1220B have different thresholds after the programming period Dp (i.e., at time point Tr) due to process variation results from intrinsic fabrication process variations between the two memory cells. Accordingly, by controlling the programming operations of the two memory cells 1220A and 1220B, the random number bit N1 would be generated and determined according to the different programmed statuses (i.e., different thresholds) of the two memory cells 1220A and 1220B.

Once the two memory cells 1220A and 1220B has been completely programmed, the random number bit N1 is recorded into the memory unit 1210 of the random number generator device 1200 and could be accessed. Please refer to FIGS. 11 and 12 again. The random number bit N1 could be read during the reading period Dr. During the reading period Dr, the voltage levels of the word line voltage Vw and the source line voltage Va would be equal to the device voltage VDD, and the two bit lines BL1 and BL2 are reset to the ground voltage. The control circuit 140 may sense and amplify the signals of the two bit lines BL1 and BL2 to determine the value of the random number bit N1. The detail of reading operation is similar to FIG. 2 and thus is not redundant described.

In the previous embodiments, the control circuit 140 may short the bit line BL1 and the second bit line BL2 during the programming period Dp and separate the bit line BL1 and the second bit line BL2 during the reading period Dr. In this way, by providing a same voltage difference to the two memory cells during the programming period Dp, only one of the two memory cells would be programmed due to different process variation results from intrinsic fabrication process variations between the two memory the two memory cells. The control circuit 140 then separate the bit line BL1 and the second bit line BL2 to read the statuses of the two memory cells to generate a random number bit.

In some embodiments of the present invention, each of the two memory cells of the memory unit may be selected from a group consisting of one-time programmable (OTP) memory cell, multi-time programmable (MTP) memory cell, electrically-erasable programmable read-only memory (EEPROM) cell, flash memory cell, phase change random access memory (PCRAM), resistive random access memory (ReRAM) cell, magnetoresistive random access memory (MRAM) cell, and ferroelectric random access memory (FeRAM) cell.

In summary, the present invention provides a way to generate a random number bit by controlling the programming a memory unit of the random number generator device. In this way, once programming of one of the two memory cells of the memory unit is done, operations of programming the other memory cell would be stopped immediately which results in that the two memory cells have different statuses. The random number bit is thus generated according the statuses of the two memory cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A random number generator device, comprising:
at least a bias line;
at least a first bit line;
at least a second bit line;
at least a memory unit, each memory unit comprising two memory cells, one of the two memory cells being coupled to the bias line and the first bit line, and another of the two memory cells being coupled to the bias line and the second bit line;
a voltage generator, coupled to the bias line, the first bit line and the second bit line for providing the two memory cells a bias voltage, a first bit line voltage and a second bit line voltage via the bias line, the first bit line and the second bit line respectively; and
a control circuit, coupled to the first bit line, the second bit line and the voltage generator, configured to generate and store a single random number bit into the two memory cells by programming the two memory cells simultaneously during a programming period and short-circuiting the first bit line and the second bit line during the programming period so as to simultaneously decrease a voltage difference between the bias line and the first bit line and a voltage difference between the bias line and the second bit line once one of the two memory cells is completely programmed while another one of the two memory cells is not completely programmed, and configured to read the single random number bit according the statuses of the two memory cells during a reading period.

2. The random number generator device of claim 1, wherein the control circuit reads the single random number bit by comparing a first current flowing through the first bit line and a second current flowing through the second bit line.

3. The random number generator device of claim 1, where each of the two memory cells is selected from a group consisting of one-time programmable (OTP) memory cell, multi-time programmable (MTP) memory cell, electrically-erasable programmable read-only memory (EEPROM) cell, flash memory cell, phase change random access memory (PCRAM), resistive random access memory (ReRAM) cell, magnetoresistive random access memory (MRAM) cell, and ferroelectric random access memory (FeRAM) cell.

4. The random number generator device of claim 1, wherein each of the two memory cells is a one-time programmable (OTP) memory cell comprising a transistor having a thick oxide region and a thin oxide region formed below a gate of the transistor, the gate of the transistor is coupled to the bias line, and programming of the two memory cells is stopped immediately once a thin oxide region of one of the two memory cells is ruptured.

5. The random number generator device of claim 1, wherein each of the two memory cells is a one-time programmable (OTP) memory cell comprising a first transistor and a second transistor, a first end of the first transistor is coupled to the first bit line or the second bit line, a second end of the first transistor is coupled to a first end of the second transistor, and a gate of the second transistor is coupled to the bias line;
wherein the first transistor is turned on during the programming period; and
wherein after the programming period, one of second transistors of the two memory cells is ruptured.

6. The random number generator device of claim 1, wherein each of the two memory cells is a one-time programmable (OTP) memory cell comprising a first transistor, a second transistor and a third transistor, a first end of the first transistor is coupled to the first bit line or the second bit line, a second end of the first transistor is coupled to a first end of the second transistor, a second end of the second transistor is coupled to a first end of the third transistor, and a gate of the third transistor is coupled to the bias line;
wherein the first transistor and the second transistor are turned on during the programming period; and
wherein programming of the two memory cells is stopped immediately once a gate oxide layer of a third transistor of one of the two memory cells is ruptured.

7. The random number generator device of claim 6, wherein a thickness of a gate oxide layer of the third transistor is less than or equal to thicknesses of gate oxide layers of the first transistor and the second transistor.

8. The random number generator device of claim 1, wherein each of the two memory cells is a flash memory cell, a control gate of the flash memory cell is coupled to a word line, a first end of the flash memory cell is coupled to the first bit line or the second bit line, and a second end of the flash memory cell is coupled to the bias line;
wherein during the programming period, a voltage applied to the word line is higher than the bias voltage and the bit line voltage, and the bit line voltage is less than the bias voltage.

9. A control method of operating a random number generator device, the random number generator device comprising:
at least a bias line;
at least a first bit line;
at least a second bit line; and
at least a memory unit, each memory unit comprising two memory cells, one of the two memory cells being coupled to the bias line and the first bit line, and another of the two memory cells being coupled to the bias line and the second bit line;
the control method comprising:
generating and storing a single random number bit into the two memory cells by programming the two memory cells simultaneously during a programming period and short-circuiting the first bit line and the second bit line during the programming period so as to simultaneously decrease a voltage difference between the bias line and the first bit line and a voltage difference between the bias line and the second bit line once one of the two memory cells is completely programmed while another one of the two memory cells is not completely programmed; and
reading the single random number bit according to statuses of the two memory cells during a reading period.

* * * * *